July 29, 1969 L. B. TAPLIN ET AL 3,457,938

PNEUMATIC OSCILLATOR

Original Filed June 25, 1963

INVENTOR.
LAEL B. TAPLIN, WALTER F. DATWYLER Jr.
JOSEPH P. MADURSKI, THOMAS E. THOMPSON
BY

ATTORNEY.

United States Patent Office 3,457,938
Patented July 29, 1969

3,457,938

PNEUMATIC OSCILLATOR

Lael B. Taplin, Walter F. Datwyler, Jr., Thomas E. Thompson, and Joseph P. Madurski, Southfield, Mich., assignors to The Bendix Corporation, a corporation of Delaware Original application June 25, 1963, Ser. No. 290,527, now Patent No. 3,392,739, dated July 16, 1968. Divided and this application Aug. 24, 1967, Ser. No. 662,995

Int. Cl. F15c 3/02

U.S. Cl. 137—82 8 Claims

ABSTRACT OF THE DISCLOSURE

A pure fluid device for producing a pulse train of fixed and known frequency using a mechanical oscillator excited by fluid pressure and producing a pulse train which corresponds in frequency to the natural frequency of the oscillator. The natural frequency can be varied by use of a mechanically-adjustable element. The fluid source used to excite the oscillator can also be the pulse train medium through a connecting chamber and bleed valve. This device can be used in conjunction with other pure fluid components operating in a digital information mode.

Cross references

The present invention is a division of co-pending U.S. application Ser. No. 290,527, filed June 25, 1963, entitled "Fluid Pulse Control," now Patent No. 3,392,739 granted July 16, 1968.

Background

The invention relates to pure fluid stream interaction amplifiers, sometimes termed "fluidics."

Basic pure fluid stream interaction amplifiers are known and illustrated in such prior patents as U.S. Patents 3,016,063 and 3,053,276. The present invention extends these known techniques to provide a device for the specific purpose of generating a fluid pulse train of fixed and known frequency. Such a device may also be capable of allowing controlled variation of the pulse train frequency.

Summary

The present invention provides a pure fluid system component for the generation of controlled frequency pulse trains.

Description of the preferred embodiments

Figure 1:
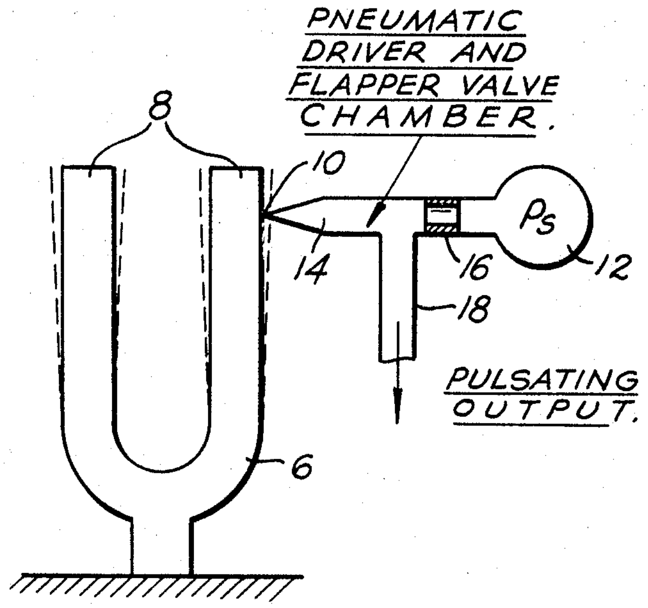
FIGURE 1 illustrates the basic invention in which the naturel frequency of the mechanical oscillator cannot be varied and the pulse train produced is of constant frequency. A tuning fork is shown as one example of a mechanical oscillator.
Figure 2:
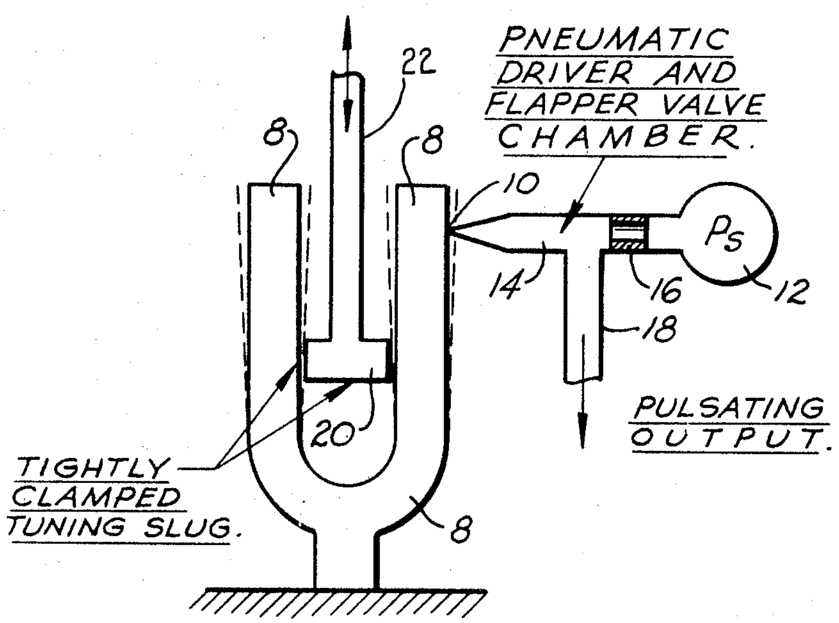
FIGURE 2 adds to FIGURE 1 a tuning element which enables the natural frequency of the mechanical oscillator to be varied, thereby producing a pulse train of variable frequency.

Two modifications of a pneumatic oscillator are shown in FIGURES 1 and 2 for producing a pneumatic pulse train whose frequency is determinable and can therefore serve as a reference or control. The tuning fork is used as an example of a mechanical oscillator possessing a natural or resonant frequency dependent upon the length of the oscillating member.

In the FIGURE 1 modification, there is shown a pneumatic tuning fork oscillator or pulse generator for producing a known and fixed frequency pneumatic pulse train. The tuning fork oscillator comprises a tuning fork 6 as the frequency-determining element having a pair of tines 8, one of which is arranged in close proximity with a nozzle 10. A high pressure source, $P_s$, contained in supply chamber 12 is connected by transmission line 14, having bleed 16, to nozzle 10; and an output line 18 is connected to line 14 intermediate to bleed 16 and nozzle 10. Tine 8 vibrates at its natural frequency, alternatively opening and closing nozzle 10 causing pressure pulses in output line 18 at this same frequency. This oscillator is self-exciting when air pressure is supplied to nozzle 10 and requires no additional initiation or excitation means.

In FIG. 2, there is shown a similar pneumatic tuning fork oscillator or pulse generator except that means have been provided to vary the natural frequency of the tuning fork in response to a mechanical position as may be applied by a throttle. The basic tuning fork oscillator may be the same as that shown in FIGURE 1 and bears the identical numerals with addition of a movable wedge or tuning slug 20 champed between the tines 8 and having a positioning rod or connection 22 for adjusting the tuning slug 20 longitudinally of the vibrating tines and varying the effective length thereof. Movement of tuning slug 20 to vary the effective length of tines 8 alters the vibrating frequency. Natural frequency is inversely proportional to effective length of the vibrating member. For example, commercially-available tuning forks so adapted have been found to produce satisfactory frequency variations of the order 3:1.

It should be obvious that other mechanical oscillators and other control means are possible.

We claim:

1. A pneumatic pulse generator comprising:
a mechanical oscillator having one or more vibrating members with a natural frequency of vibration;
a fluid transmitting means having a fluid pressure source, an input transmission line connected to said source, a nozzle connected to said transmission line, and an output transmission line;
said mechanical oscillator arranged in close proximity to said nozzle and excited vibrationally by a fluid stream ejected therefrom; and
said mechanical oscillator vibrations thereby causing the fluid in said output line of said fluid transmitting means to contain a train of pressure pulses corresponding in frequency to the frequency of vibration of said mechanical oscillator.

2. A pneumatic pulse generator as claimed in claim 1 including mechanical adjustment means operative to alter the natural frequency of said mechanical oscillator by altering the effective length of said vibrating member or members.

3. A pneumatic pulse generator comprising:
a tuning fork having a pair of tines with a natural frequency of vibration;
a fluid transmitting means having a fluid pressure source, an input transmission line connected to said source, a nozzle connected to said transmission line and an output transmission line;
said tuning fork arranged in close proximity to said nozzle and excited vibrationally by a fluid stream ejected therefrom; and
said tuning fork vibrations thereby causing the fluid in said output line of said fluid transmitting means to contain a train of pressure pulses corresponding in frequency to the frequency of vibration of said tuning fork.

4. A pneumatic pulse generator as claimed in claim 3 including mechanical adjustment means operative to alter the natural frequency of said tuning fork by altering the effective length of said tines of said tuning fork.

5. A pneumatic pulse generator as claimed in claim 3 including a mechanically-adjustable tuning slug clamped between said tines, said tuning slug being positionable longitudinally of said pair of tines and operative to alter the natural frequency of said tuning fork by altering the length of said pair of tines.

6. A pneumatic pulse generator comprising:

a high pressure fluid supply source;

a first passage connected to said source;

a fixed restriction in said first passage;

a second output passage connected to said first passage downstream of said restriction;

a jet nozzle connected to said first passage downstream of said restriction; and a tuning fork having a pair of tines with a vibration frequency, said tuning fork having one of said tines arranged in close proximity to said jet nozzle, said tuning fork operative when vibrating to vary fluid pressure upstream of said jet nozzle and downstream of said fixed restriction to provide a fluid pulse train output in said second passage corresponding in frequency to the vibration frequency of said tuning fork.

7. A pneumatic pulse generator as claimed in claim 6 including mechanical adjustment means operative to alter the natural frequency of said tuning fork by altering the effective length of said tines of said tuning fork.

8. A pneumatic pulse generator as claimed in claim 6 including a tuning slug clamped between said pair of tines, said tuning slug being positionable longitudinally of said pair of tines and vary the vibrating frequency thereof.

References Cited

UNITED STATES PATENTS

| | | |
|---|---|---|
| 2,729,751 | 1/1956 | Westman. |
| 2,879,467 | 3/1959 | Stern. |

ALAN COHAN, Primary Examiner

U.S. Cl. X.R.

137—81.5, 624.14